US009367417B2

(12) United States Patent
Jung et al.

(10) Patent No.: US 9,367,417 B2
(45) Date of Patent: Jun. 14, 2016

(54) NONVOLATILE MEMORY DEVICE INCLUDING DUMMY WORDLINE, MEMORY SYSTEM, AND METHOD OF OPERATING MEMORY SYSTEM

(71) Applicant: Samsung Electronics Co., Ltd., Suwon-Si, Gyeonggi-Do (KR)

(72) Inventors: Bong-Kil Jung, Seoul (KR); Dae-Seok Byeon, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 122 days.

(21) Appl. No.: 14/463,130

(22) Filed: Aug. 19, 2014

(65) Prior Publication Data
US 2015/0113342 A1 Apr. 23, 2015

(30) Foreign Application Priority Data

Oct. 17, 2013 (KR) ........................ 10-2013-0124165

(51) Int. Cl.
*G11C 29/50* (2006.01)
*G06F 11/26* (2006.01)
*G11C 8/14* (2006.01)
*G11C 16/34* (2006.01)
*G11C 29/42* (2006.01)
*G11C 29/52* (2006.01)
*G11C 29/04* (2006.01)

(52) U.S. Cl.
CPC *G06F 11/26* (2013.01); *G11C 8/14* (2013.01); *G11C 16/3418* (2013.01); *G11C 29/42* (2013.01); *G11C 29/52* (2013.01); *G11C 2029/0411* (2013.01)

(58) Field of Classification Search
CPC .... G11C 13/004; G11C 8/14; G11C 11/4097; G11C 13/0028; G11C 2029/0411; G11C 29/52; G11C 7/18; G11C 8/08; G11C 29/50004; G06F 11/26
USPC .............. 714/710, 721, 746, 773; 365/230.03
See application file for complete search history.

(56) References Cited

U.S. PATENT DOCUMENTS

| 7,062,686 | B2 | 6/2006 | Moritomo |
| 7,181,611 | B2 | 2/2007 | Chang et al. |
| 7,590,015 | B2 * | 9/2009 | Kodaira .............. G11C 29/806 365/200 |
| 7,873,779 | B2 | 1/2011 | Maddali et al. |
| 7,898,865 | B2 * | 3/2011 | Baek .................. G11C 11/5628 365/185.11 |
| 8,107,297 | B2 | 1/2012 | Baek et al. |
| 8,159,882 | B2 | 4/2012 | Honma et al. |

(Continued)

FOREIGN PATENT DOCUMENTS

KR 100960405 B1 5/2010

*Primary Examiner* — Phung M Chung
(74) *Attorney, Agent, or Firm* — Harness, Dickey & Pierce, P.L.C.

(57) ABSTRACT

A method of operating a memory system includes reading data of first memory cells, the first memory cells being connected to a first wordline from among a plurality of wordlines, the plurality of wordlines including one or more dummy wordlines and one or more normal wordlines; determining whether the first wordline is one of the one or more dummy wordlines by determining, based on the read data, a number of the first memory cells having a first threshold voltage state, the one or more dummy wordlines being wordlines the memory cells of which have been programmed with dummy data, the one or more normal wordlines being wordlines that are not dummy wordlines; and performing a repair algorithm for correcting an error in the read data, selectively according to a result of the determination.

17 Claims, 19 Drawing Sheets

(56) References Cited

U.S. PATENT DOCUMENTS

| | | |
|---|---|---|
| 8,199,583 B2 | 6/2012 | Kim et al. |
| 8,339,861 B2 | 12/2012 | Chang et al. |
| 8,379,456 B2 | 2/2013 | Park et al. |
| 8,406,054 B2 | 3/2013 | Shibata et al. |
| 8,432,733 B2 | 4/2013 | Higashitani |
| 2009/0238006 A1* | 9/2009 | Nobunaga .............. G11C 16/10 365/185.19 |
| 2011/0173380 A1 | 7/2011 | Yano et al. |
| 2011/0283165 A1 | 11/2011 | Nishiyama |
| 2012/0084627 A1 | 4/2012 | Post et al. |
| 2014/0068384 A1* | 3/2014 | Kwak .................. G06F 11/1068 714/773 |
| 2014/0300190 A1* | 10/2014 | Weber .................... H02J 11/00 307/31 |
| 2015/0117100 A1* | 4/2015 | Park ..................... G11C 16/225 365/185.03 |

* cited by examiner

NONVOLATILE MEMORY DEVICE INCLUDING DUMMY WORDLINE, MEMORY SYSTEM, AND METHOD OF OPERATING MEMORY SYSTEM

CROSS-REFERENCE TO RELATED APPLICATIONS

This application claims priority under 35 U.S.C. §119 to Korean Patent Application No. 10-2013-0124165, filed on Oct. 17, 2013, in the Korean Intellectual Property Office, the disclosure of which is incorporated herein in its entirety by reference.

BACKGROUND

Example embodiments of the inventive concepts relate to a memory device, and more particularly, to a nonvolatile memory device, a memory system, and a method of operating the memory system.

As a semiconductor memory device, a nonvolatile memory device includes a plurality of memory cells that store data in a nonvolatile manner. As an example of the nonvolatile memory device, a flash memory device may include multi-level cells that store 2 or more bits of data in each cell. The nonvolatile memory device may be used in portable phones, digital cameras, portable digital assistants (PDAs), mobile computer devices, stationary computer devices, and other devices.

In the nonvolatile memory device, a program operation may be performed a plurality of times on each wordline to store 2 or more bits of data in the multi-level cells. However, when an undesirable situation such as a sudden power-off (SPO) occurs, a program operation may be interrupted without being completed. In this case, it may be difficult to ensure data reliability.

SUMMARY

At least some example embodiments of the inventive concepts provide a nonvolatile memory device that may ensure data reliability and efficiently recover data in an undesirable situation such as a sudden power-off (SPO), a memory system, and a method of operating the memory system.

According to at least one example embodiment of the inventive concepts, a method of operating a memory system, the method including reading data of first memory cells, the first memory cells being connected to a first wordline from among a plurality of wordlines, the plurality of wordlines including one or more dummy wordlines and one or more normal wordlines; determining whether the first wordline is one of the one or more dummy wordlines by determining, based on the read data, a number of the first memory cells having a first threshold voltage state, the one or more dummy wordlines being wordlines the memory cells of which have been programmed with dummy data, the one or more normal wordlines being wordlines that are not dummy wordlines; and performing a repair algorithm for correcting an error in the read data, selectively according to a result of the determination.

The method may further include performing an error correction code (ECC) operation on the read data, wherein the determining of whether the first wordline is one of the one or more dummy wordlines is performed when an ECC failure has occurred in the read data.

The method may further include performing a repair algorithm on the read data in which the ECC failure has occurred when the first wordline is determined to be one of the one or more normal wordlines, wherein a repair algorithm is not performed on the read data in which the ECC failure has occurred when the first wordline is determined to be one of the one or more dummy wordlines.

Completing an operation of storing multi bit data in memory cells of a wordline selected for programming, from among the plurality of wordlines, may include performing a programming operation on the selected wordline a plurality of times, and the method further include beginning the operation of storing multi bit data in the first wordline; determining whether the first wordline is an open wordline after a sudden power-off (SPO) occurs, open wordlines being wordlines, from among the plurality of wordlines, on which the operation of storing multi bit data began but was not completed at the time of the SPO, the SPO being an event where power being supplied to the memory system ceases, the normal wordlines being wordlines that are neither dummy wordlines nor open wordlines; and programming dummy data in the memory cells connected to the first wordline, when the first wordline is determined to be an open wordline.

A level of a first verify voltage for programming dummy data corresponding to a first threshold voltage state in the memory cells connected to an open wordline, from among the plurality of wordlines, may be set to be different from a level of a second verify voltage for programming data of the first threshold voltage state in memory cells connected to one of the one or more normal wordlines.

The level of the first verify voltage may be set to be lower than the level of the second verify voltage.

The method may further include reading data of memory cells connected to second to nth wordlines from among the plurality of wordlines, nbeing an integer equal to or greater than 2; and generating a mapping table by identifying read data corresponding to a normal wordline as valid data in the mapping table and not identifying read data corresponding to a dummy wordline as valid data in the mapping table.

An ECC operation may not be performed on the read data when the first wordline is determined to be one of the one or more dummy wordline.

The first threshold voltage state may correspond to a threshold voltage distribution that has the greatest threshold voltage among levels of a plurality of threshold voltage distributions, and the first wordline may be determined to be one of the one or more dummy wordlines when number of the first memory cells having the first threshold voltage state is smaller than a threshold value.

Each of the first memory cells may be a multi-level cell that stores 2 or more bits of data.

According to at least one example embodiment of the inventive concepts, a method of operating a memory system may include programming user data by performing a program operation n times on memory cells connected to a first wordline, n being an integer equal to or greater than 2; determining a second wordline to be an open wordline, open wordlines being wordlines upon the memory cells of which less than n program operations are performed; and programming dummy data in memory cells connected to the second wordline, wherein a level of a first verify voltage for programming user data corresponding to a first threshold voltage state in the memory cells connected to the first wordline is set to be different from a level of a second verify voltage for programming dummy data corresponding to the first threshold voltage state in the memory cells connected to the second wordline.

A voltage level of a threshold voltage distribution corresponding to the first threshold voltage state of the memory cells connected to the first wordline may be greater than a voltage level of a threshold voltage distribution corresponding to the first threshold voltage state of the memory cells connected to the second wordline.

The method may further include detecting a sudden power-off (SPO), the SPO being an event where power being supplied to the memory system ceases, wherein the determining of the second wordline is performed after the SPO is detected.

The method may further include reading data of the memory cells connected to the second wordline by using a first read voltage; and detecting a number of the memory cells having the first threshold voltage state based on the read data, wherein a repair algorithm is not performed on the read data read from the memory cells connected to the second wordline, based on a result of the detection.

The method may further include reading data of the memory cells connected to the second wordline by using a first read voltage; and detecting a number of the memory cells having the first threshold voltage state based on the read data; and performing an error correction operation on the read data read from the memory cells connected to the second wordline selectively according to a result of the detection.

According to at least one example embodiment of the inventive concepts, a method of operating a memory system including a memory device includes storing multi bit groups of data in a plurality of memory cells, the storing including programming a selected threshold state into a first memory cell of the plurality of memory cells, the selected threshold state being the one of a plurality of threshold states that corresponds the multi bit group of data being stored in the first memory cell, the plurality of memory cells being connected to a selected wordline of the memory device; reading the data stored in the plurality of memory cells; determining a number of the plurality of memory cells having a first threshold voltage state from among the plurality of threshold voltage states based on the read data; determining whether the selected wordline is a dummy wordline or a normal wordline based on the determined number; and performing a repair algorithm for correcting an error in the read data of the plurality of memory cells when the selected wordline is determined not to be the dummy wordline.

For at least the first threshold voltage state of the plurality of threshold voltage states, when the selected wordline is determined to be the dummy wordline, a first programming verification voltage may be used when programming the first threshold voltage state into memory cells from among the plurality of memory cells, when the first wordline is determined to be the normal wordline, a second programming verification voltage may be used when programming the first threshold voltage state into memory cells from among the plurality of memory cells, and the first programming verification voltage may be different from the second programming verification voltage.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF THE EMBODIMENTS

Figure 1:
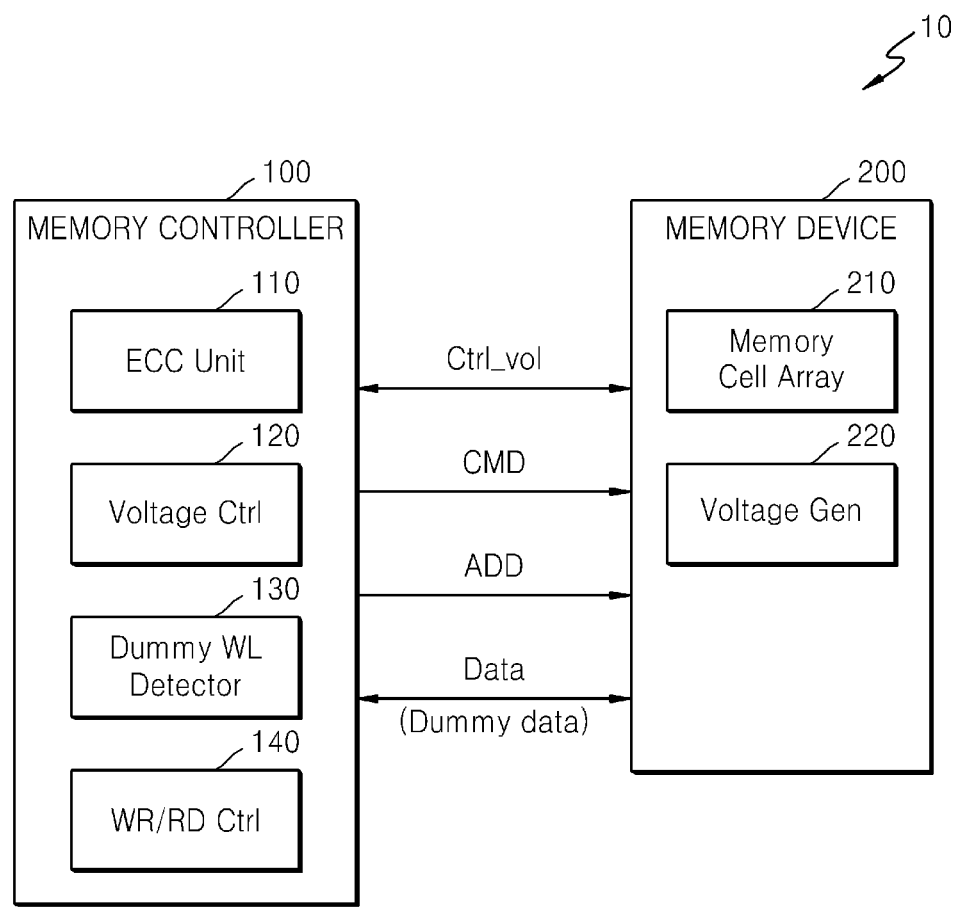
FIG. 1 is a block diagram of a memory system according to at least one embodiment of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by those of ordinary skill in the art to which the inventive concept pertains. It will also be understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a memory system 10 according to at least one embodiment of the inventive concepts.

Referring to FIG. 1, the memory system 10 may include a memory controller 100 and a memory device 200. The memory controller 100 performs a control operation on the memory device 200. As an example, the memory controller 100 may provide an address ADD and a command CMD to the memory device 200 to control a program (or write)/read/erase operation on the memory device 200. Also, data for a program operation and read data may be communicated between the memory controller 100 and the memory device 200.

The memory device 200 may include a memory cell array 210 and a voltage generator 220. The memory cell array 210 may include a plurality of memory cells that are disposed in regions where a plurality of wordlines and a plurality of bit lines intersect with each other. The memory cell array 210 may include non-volatile memory cells that store data in a non-volatile manner. The non-volatile memory cells of the memory cell array 210 may include flash memory cells such as a NAND flash memory cell array or a NOR flash memory cell array. Hereinafter, embodiments of the inventive concept will be described on the assumption that the memory cell array 210 includes a flash memory cell array and thus the memory device 200 is a non-volatile memory device and hereinafter referred to as so. However, embodiments of the inventive concept are not limited thereto, and the memory cell array 210 may include other types of memory cells, for example, resistive memory cells such as resistive RAM (RRAM) cells, phase-change RAM (PRAM) cells, or magnetic RAM (MRAM) cells.

The memory controller 100 may include an error correction code (ECC) unit 110 and a voltage controller 120. The ECC unit 110 performs an error correction-related operation. For example, the ECC unit 110 may perform an ECC encoding process and an ECC decoding process by using an error correction algorithm such as a Reed-Solomon (RS) code, a Hamming code, or a cyclic redundancy code (CRC). The ECC encoding process includes an operation of generating a parity bit based on data to be programmed, and the ECC decoding process includes an operation of detecting an error bit from data read from the memory cell array 210 and correcting the error bit. The ECC unit 110 may be set to have a predetermined error correction rate. The number of parity bits per data of the same size may increase as the error correction rate increases. For example, as the error correction rate increases, an error of more bits may be corrected per predetermined data size (or ECC unit).

The voltage controller 120 may generate a voltage control signal Ctrl_vol for controlling at least one voltage level used in the non-volatile memory device 200. As an example, the voltage controller 120 may generate a voltage control signal Ctrl_vol for controlling a voltage level of a wordline for reading data from the memory cell array 210 or programming data into the memory cell array 210.

The memory controller 100 may further include a dummy wordline (WL) detector 130 and a write/read (WR/RD) controller 140. For example, when a memory cell included in the memory cell array 210 is a multi-level cell, a high voltage is applied to each wordline to program 2 or more bits of data. Also, a program operation may be performed a plurality of times on each wordline. For example, when a program operation is completed by performing the program operation three times on each wordline, data may be normally written into the memory cells connected to the wordline on which the program operation is performed three times. In a program operation, when a program operation is not completely performed three times on at least one wordline due to an undesirable situation such as a sudden power-off (SPO), data may not be normally written. The wordline on which a data write operation is not normally completed may be defined as an open wordline.

When an open wordline exists due to an undesirable situation such as an SPO, dummy data may be written into the memory cells connected to the open wordline, to improve characteristics in view of a pass voltage (Vpass) window. For example, a threshold voltage distribution resulting from completely performing the program operation three times is formed by completely performing the program operation three times on the memory cells connected to the open wordline according to dummy data. The wordline, in which dummy data is written, may be defined as a dummy wordline. The dummy WL detector 130 may detect a dummy wordline among a plurality of wordlines included in the memory cell array 210. Dummy data may be, for example, randomly or, alternatively, pseudorandomly, generated data. As used herein, the term random data includes pseudorandomly generated data.

The WR/RD controller 140 may output a command CMD and an address ADD to the non-volatile memory device 200 in a memory operation, for example, a program/read operation. The address ADD may be used to designate a region of the memory cell array 210 to be programmed or read. For example, when the memory cell array 210 includes a plurality of pages and a program/read unit is a page, the address ADD may be used to designate a page.

According to at least one embodiment of the inventive concepts, by detecting a dummy wordline, an unnecessary error correction operation is prevented from being performed on the memory cells connected to the dummy wordline. For example, in an ECC operation on dummy data, an ECC failure (for example, a detection of an uncorrectable error) may occur and a repair algorithm may be performed to correct an uncorrectable error. However, a long time may be taken to perform the repair algorithm. Since the dummy data is irrelevant to actual user data, it is unnecessary to perform a repair algorithm for correcting an error that is uncorrectable by an ECC operation. Accordingly, an operation of detecting whether the wordline is a dummy wordline is performed before a repair algorithm is performed.

Also, according to at least one embodiment of the inventive concepts, a verify voltage level of at least one state may be changed in a dummy data program operation on an open wordline. For example, when 3-bit data is programmed in each memory cell, threshold voltage distributions of memory cells connected to each wordline may have eight states, and whether the wordline is a dummy wordline may be detected by changing a level of at least one threshold voltage distribution. The WR/RD controller 140 may control a program operation on the dummy data. Also, the dummy WL detector 130 may detect whether the wordline is a dummy wordline, by detecting a threshold voltage distribution of the memory cells connected to the wordline.

Figure 2:
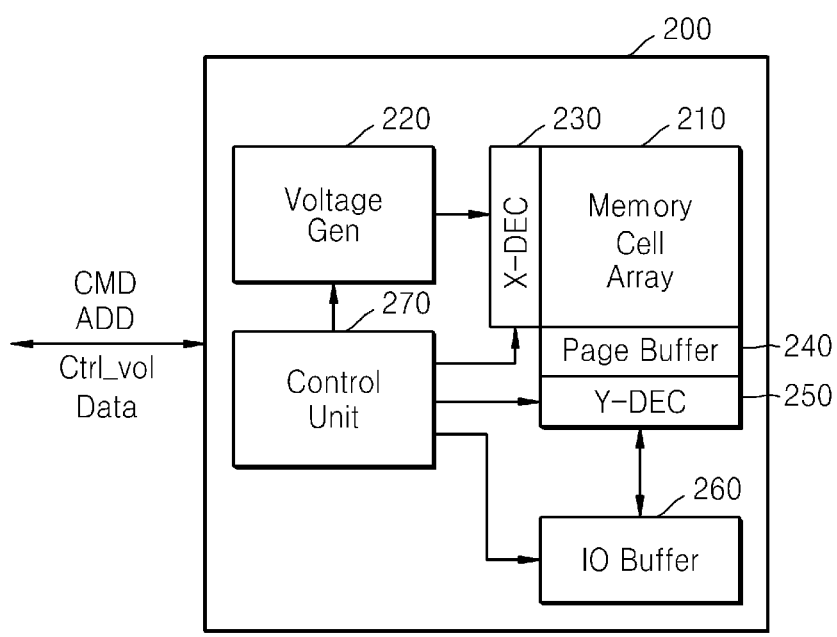
FIG. 2 is a block diagram of an example of a nonvolatile memory device of FIG. 1.

An example of detailed configurations and operations of the memory system 10 of FIG. 1 will be described below. FIG. 2 is a block diagram of an example of the non-volatile memory device 200 of FIG. 1.

As illustrated in FIG. 2, the non-volatile memory device 200 may include: a memory cell array 210 including a plurality of memory cells; a voltage generator 220; a row decoder (X-DEC) 230; a page buffer 240; a column decoder (Y-DEC) 250; an input/output (I/O) buffer 260; and a control unit 270.

Various signals for controlling a program/read/erase operation are provided to the non-volatile memory device 200. For example, a command CMD and an address ADD may be provided to the non-volatile memory device 200 in a memory operation. Also, data may be provided to the non-volatile memory device 200 in a program operation, and data read from the non-volatile memory device 200 may be provided to the memory controller 100 in a read operation.

The memory cell array 210 may include one or more memory blocks, and the memory block may be defined as a data erase unit of the non-volatile memory device 200. Also, each memory block may include a plurality of pages, and each page may include a plurality of memory cells connected to the same wordline. Also, each page may be divided into a plurality of regions, and for example, an ECC unit as an error correction unit may be defined as the region.

The non-volatile memory device 200 performs a memory operation in response to various commands CMD, addresses ADD and data from the memory controller 100, and the control unit 270 controls various operations in the non-volatile memory device 200. The X-DEC 230 is connected to the memory cell array 210 through wordlines. In response to a row address, the X-DEC 230 drives each of a selected wordline and an unselected wordline by a wordline voltage.

The Y-DEC 250 operates in response to a column address. The Y-DEC 250 selects data latched in the page buffer 240 and transfers the data to the I/O buffer 260. Also, the Y-DEC 250 provides data stored in the I/O buffer 260 to the page buffer 240. The I/O buffer 260 stores data received from the memory controller 100, and transfers data read from the memory cell array 210 to the memory controller 100. In a program operation, the voltage generator 220 generates wordline voltages for various memory operations such as program, read and erase operations and provides the wordline voltages to the X-DEC 230.

Figure 3A:
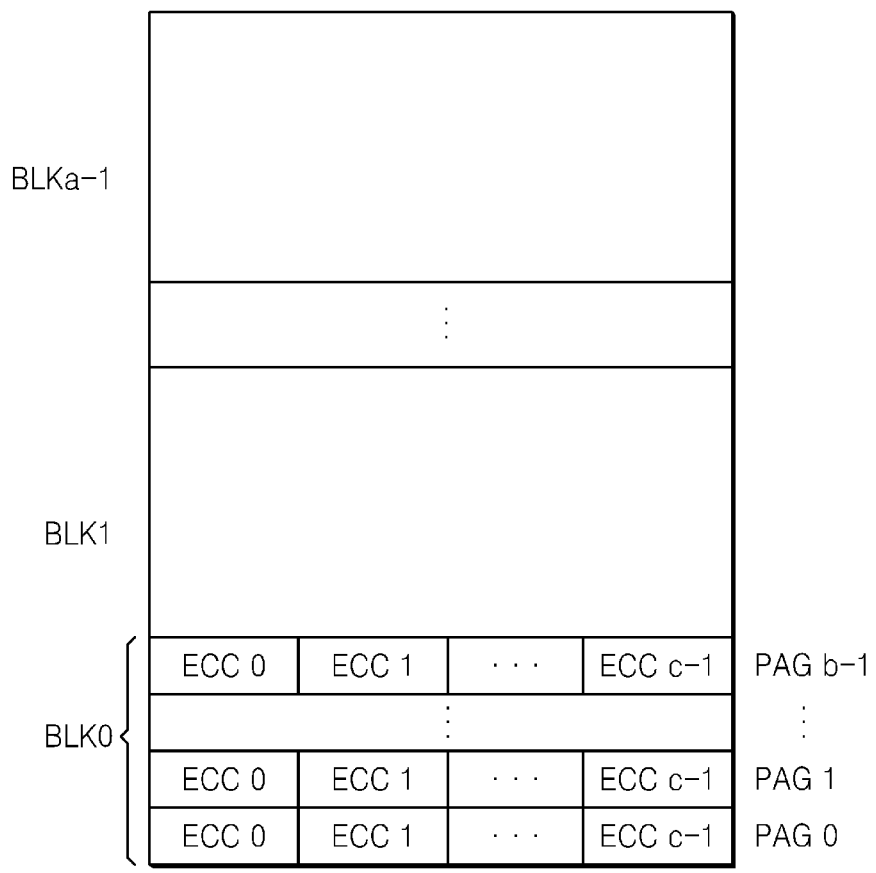
FIGS. 3A and 3B are diagrams illustrating an example of a memory cell array included in the nonvolatile memory device of FIG. 2.
Figure 3B:
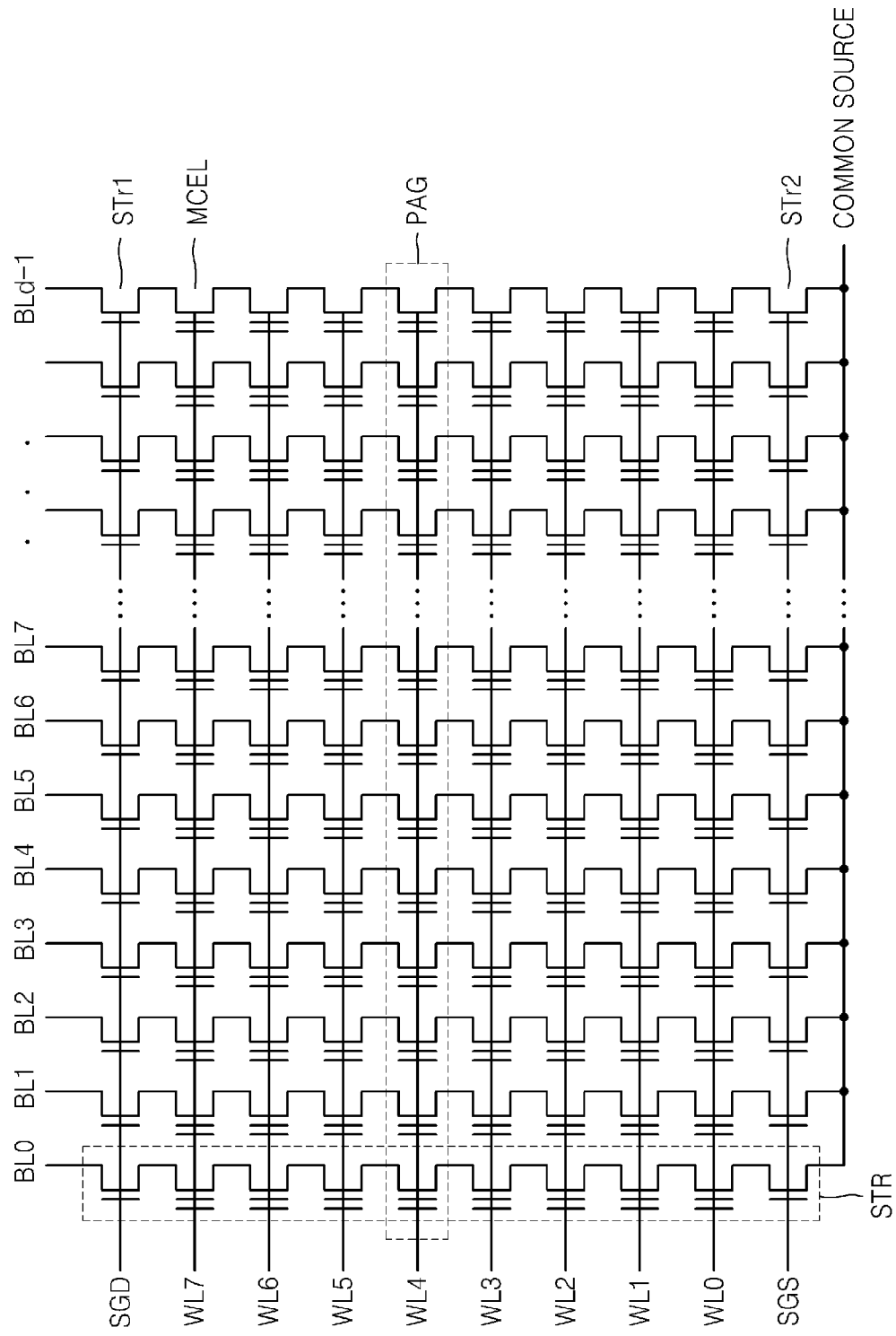

FIGS. 3A and 3B are diagrams illustrating an example of the memory cell array 210 included in the non-volatile memory device 200 of FIG. 2. Referring to FIG. 3A, the memory cell array 210 may be a flash memory cell array. In this case, the memory cell array 210 may include "a" number of blocks BLK0 to BLKa-1 (a: an integer equal to or greater than 2), and each of the blocks BLK0 to BLKa-1 may include "b" number of pages PAG0 to PAGb-1 (b: an integer equal to or greater than 2). Also, each of the pages PAG0 to PAGb-1 may include "c" number of ECC units ECC0 to ECCc-1 (c: an integer equal to or greater than 2). For the convenience of illustration, FIG. 3A illustrates only the pages PAG0 to PAGb-1 and the ECC units ECC ECC0 to ECCc-1 of the block BLK0; however, the other blocks BLK1 to BLKa-1 may also have the same structure as the block BLK0.

FIG. 3B is a circuit diagram illustrating an example of the block BLK0 of FIG. 3A. Referring to FIG. 3B, the memory cell array 210 may include NAND flash memory cells. In this case, each of the blocks BLK0 to BLKa-1 illustrated in FIG. 3A may be implemented similarly by the circuit diagram illustrated in FIG. 3B. Referring to FIG. 3B, each of the blocks BLK0 to BLKa-1 may include "d" number of strings STR (d: an integer equal to or greater than 2) in which eight memory cells MCEL are connected in series in the direction of bit lines BL0 to BLd-1. Each of the strings STR may include a drain select transistor STr1 and a source select transistor STr2 that are respectively connected to both ends of the memory cells MCEL connected in series.

The NAND flash memory device having the structure of FIG. 3B may perform an erase operation in units of blocks, and perform a program/read operation in units of pages PAG corresponding to wordlines WL0 to WL7. FIG. 3B illustrates an example in which each block includes eight pages PAG corresponding to eight wordlines WL0 to WL7. However, the blocks BLK0 to BLKa-1 of the memory cell array 210 according to at least one embodiment of the inventive concepts may include a different number of memory cells and pages from the number of memory cells MCEL and pages PAG illustrated in FIG. 3B.

Figure 4A:
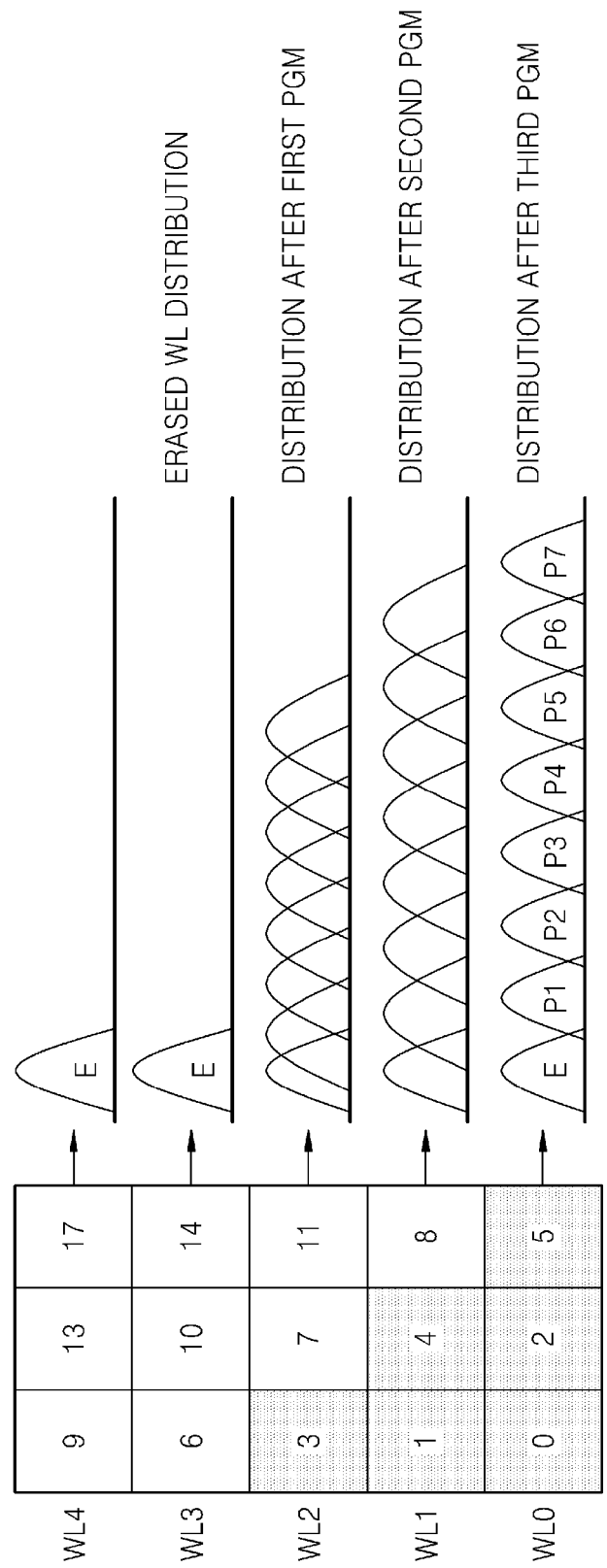
FIGS. 4A, 4B, and 4C are graphs illustrating an example of a threshold voltage distribution of memory cells programmed to a plurality of states.
Figure 4B:
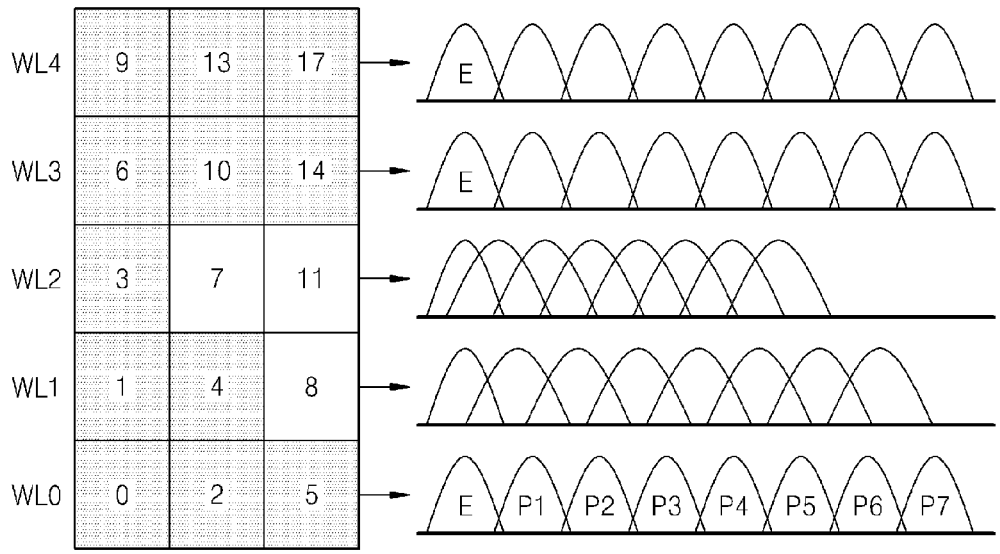
Figure 4C:
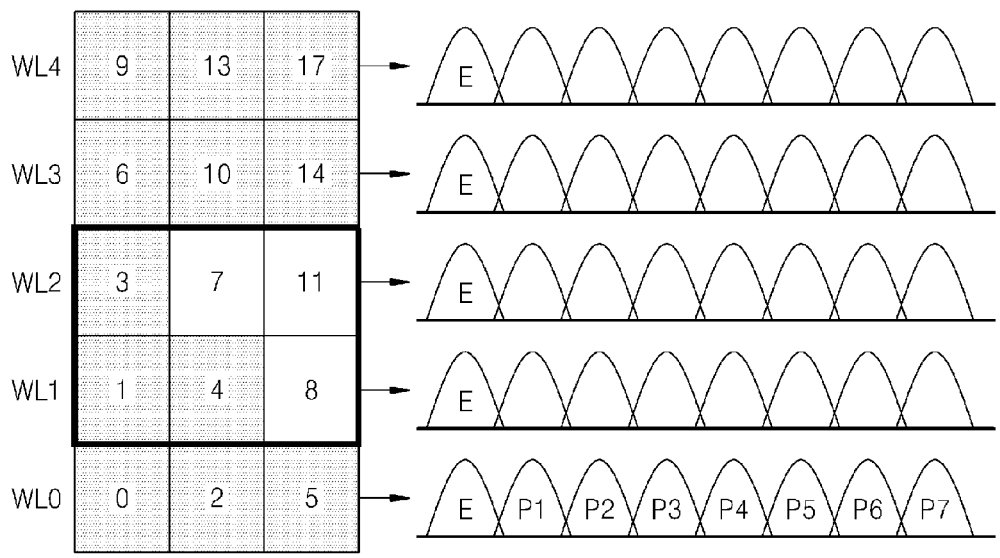

FIGS. 4A, 4B, and 4C are graphs illustrating an example of a threshold voltage distribution of memory cells programmed to a plurality of states. Hereinafter, it is assumed that a non-volatile memory device includes a triple-level cell that stores 3-bit data in each memory cell.

As described above, when a high voltage is applied to a wordline to perform a program operation and 2 or more bits of data is stored in each memory cell, a program operation is performed a plurality of times on each wordline in consideration of the occurrence of coupling between wordlines. For example, a program operation may be repeated several times by performing a program operation by a low voltage level, and a program operation may be performed three times on the memory cells connected to each wordline, as illustrated in FIG. 4A. A program operation may be performed on the wordlines in the order illustrated in FIG. 4A. For example, a program operation may be performed in the order of the first wordline WL0, the second wordline WL1, the first wordline WL0, the third wordline WL2, the second wordline WL1, the first wordline WL0, ...

In FIG. 4A, the number of blocks illustrated as hatched or shaded corresponding to each wordline may correspond to the number of times of performing a program operation on the wordline. The memory cells connected to the first wordline WL0 may have a normal threshold voltage distribution resulting from the completion of performing the program operation three times, and the second wordline WL1 and the third wordline WL2, on which the program operation is not completed, may not have a normal threshold voltage distribution.

When an undesirable situation such as an SPO occurs during the performing of a program operation several times on each wordline, the memory controller performs subsequent data writing on new wordlines (for example, the fourth and fifth wordlines WL3 and WL4) since it has not determined a proper reliability of wordline data that is being programmed. As described above, the second and third wordlines WL1 and WL2, on which the program operation is not completed, may be defined as an open wordline, and the memory cells connected to the open wordline may be set to have a normal threshold voltage distribution, by programming dummy data in the open wordline. FIG. 4B illustrates a threshold voltage distribution before the programming of dummy data in the open wordline, and FIG. 4C illustrates a threshold voltage distribution after the programming of dummy data in the open wordline.

Figure 5A:
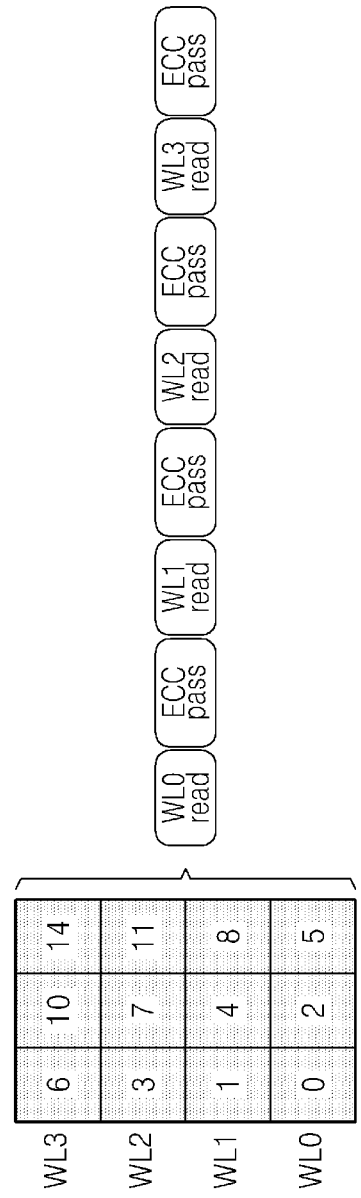
FIGS. 5A and 5B are diagrams illustrating an example of a read operation on a nonvolatile memory device.
Figure 5B:
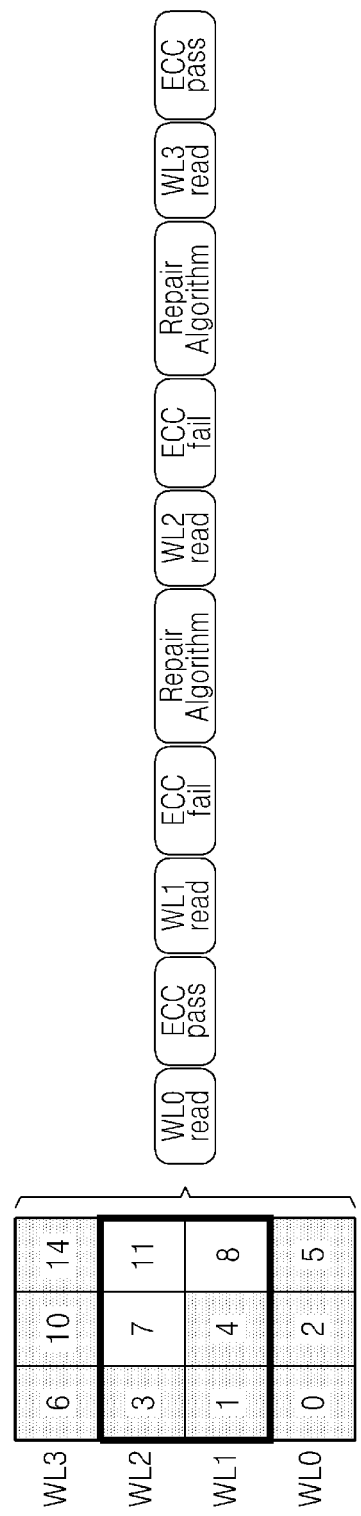

FIGS. 5A and 5B are diagrams illustrating an example of a read operation on a non-volatile memory device. A read operation may be performed for various purposes. For example, a normal read operation may be performed to use user data. As another example, after the occurrence of an SPO, the memory controller may perform a read operation on all wordlines to determine how the data of the non-volatile memory device is constructed, and generate a mapping table according to a result of the read operation. FIGS. 5A and 5B illustrate an example in which a read operation is performed on all wordlines of the non-volatile memory device after the occurrence of an SPO.

FIG. 5A illustrates a case where all wordlines are normal wordlines, and an ECC operation is performed on each wordline after a data read operation. When read data on the first wordline WL0 ECC-passes, a read operation is performed on the second wordline WL1 and an ECC operation is performed on the read data. When the ECC operation passes, a read operation is performed on the next wordline.

On the other hand, as illustrated in FIG. 5B, some wordlines may be dummy wordlines in which dummy data is programmed. For example, the second wordline WL1 and the third wordline WL2 may be dummy wordlines. Since the dummy data is data that is irrelevant to user data and is randomly programmed, an ECC failure may occur in the data obtained by the read operation on the second wordline WL1 and an additional repair algorithm may be performed to recover data. The additional repair algorithm may be performed under the control of the memory controller. For example, the additional repair algorithm may be performed by setting a new read voltage for minimizing error occurrence and by reading data while changing a read voltage. Since the dummy data is uncorrectable even by the additional repair algorithm, a time taken by an unnecessary repair algorithm may increase.

Figure 6:
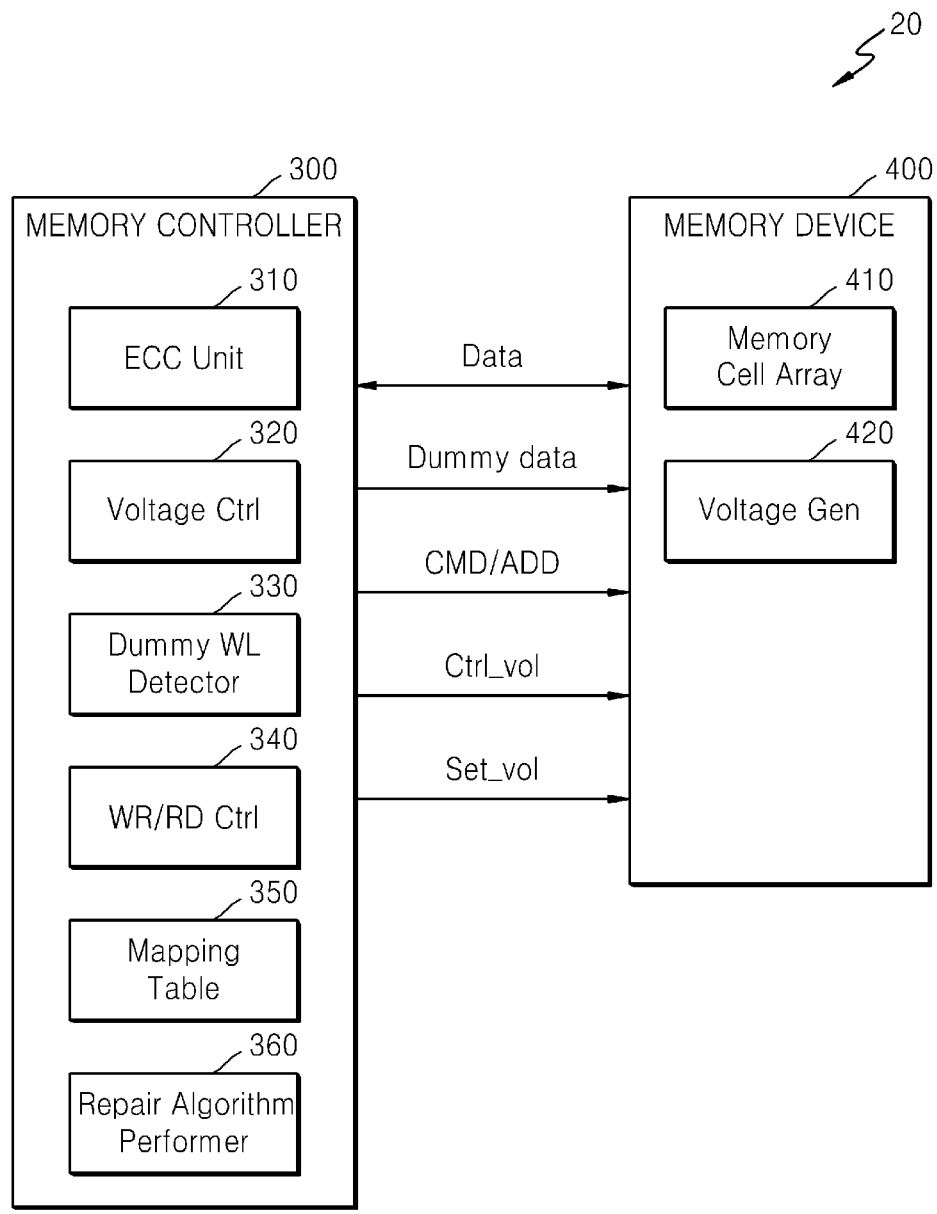
FIG. 6 is a block diagram of a memory system according to at least one example embodiment of the inventive concepts.

A dummy data program and read operation according to at least one embodiment of the inventive concepts will be described below with reference to FIG. 6. FIG. 6 is a block diagram of a memory system 20 according to at least one example embodiment of the inventive concepts.

As illustrated in FIG. 6, the memory system 20 may include a memory controller 300 and a memory device 400. The memory controller 300 performs a control operation on the memory device 400. As an example, the memory controller 300 may provide an address ADD and a command CMD to the memory device 400, and data may be communicated between the memory controller 300 and the memory device 400. Also, as described above, dummy data for programming dummy data on an open wordline may be provided to the memory device 400, and a voltage control signal Ctrl_vol for controlling a voltage (for example, a program voltage or a read voltage) in the memory device 400 may be provided to the memory device 400. Also, setting information set_vol for setting a level of a verify voltage may be provided to the memory device 400 in a program and/or read operation in a plurality of states.

Figure 7A:
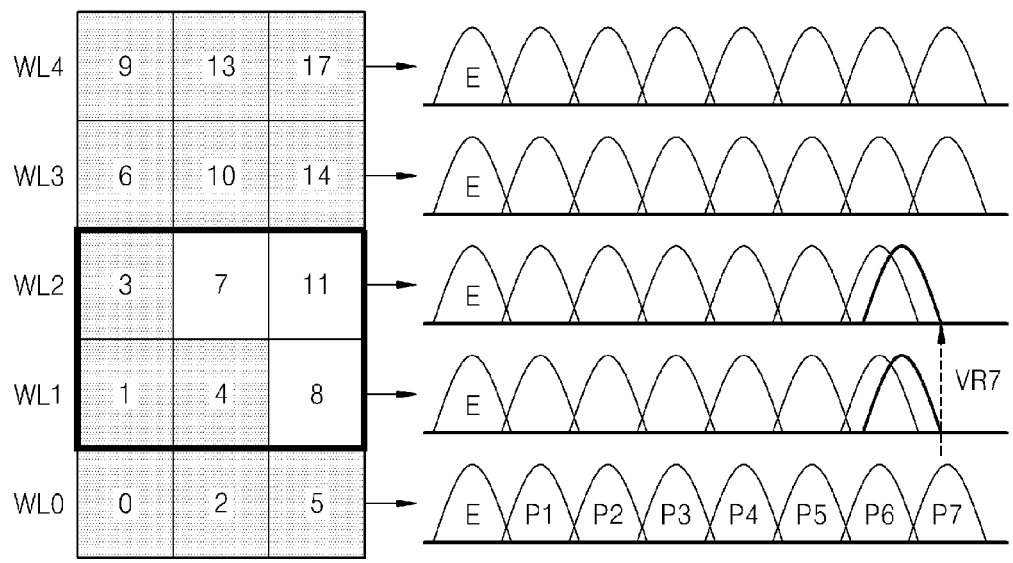
FIGS. 7A and 7B are diagrams illustrating an example of a threshold voltage distribution of a plurality of wordlines.
Figure 7B:
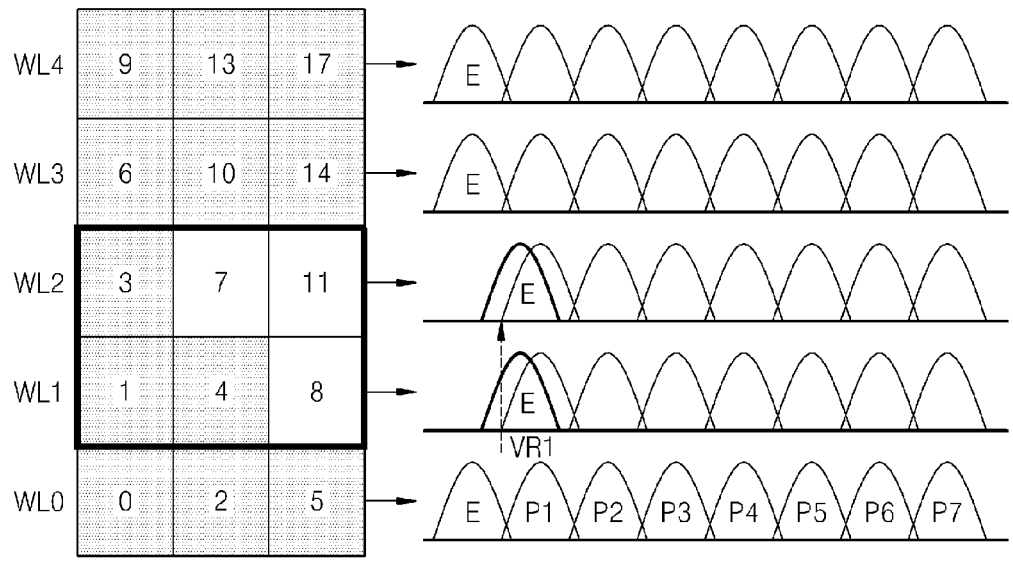

The memory controller 300 may include an ECC unit 310, a voltage controller 320, a dummy WL detector 330, a WR/RD controller 340, a mapping table 350, and a repair algorithm performer 360. Also, the memory device 400 may include a memory cell array 410 and a voltage generator 420. Operations of the memory system 20 illustrated in FIG. 6 will be described below with reference to FIGS. 7A and 7B. FIGS. 7A and 7B are diagrams illustrating an example of a threshold voltage distribution of a plurality of wordlines.

An SPO may occur during the performing of a data program operation, and thus some wordlines may correspond to open wordlines on which a program operation is not completed. When dummy data is provided to the memory device 400, a dummy program operation is performed on an open wordline.

The dummy program operation may be performed such that a position of a threshold voltage distribution corresponding to a specific state is different from a position of a threshold voltage distribution corresponding to the same state in which a normal program operation is performed. To this end, setting information set_vol for differently setting a level of a verify voltage for programming the specific state may be provided to the memory device 400. When 3-bit data is stored in each memory cell, a threshold voltage distribution may include eight states (an erase state and first to seventh program states). FIG. 7A illustrates an example in which a level of a verify voltage for programming the seventh program state P7 is set to be lower than a level of a verify voltage for programming the seventh program state P7 in a normal program operation.

Accordingly, when a read operation is performed by using a read voltage (for example, a seventh read voltage VR7 for determining data of the seventh program state P7, when a threshold voltage distribution of a normal program state is provided, a relatively large number of memory cells have a higher threshold voltage than the seventh read voltage VR7. On the other hand, according to a threshold voltage distribution of a wordline on which a dummy program operation is performed, a relatively small number of memory cells have a higher threshold voltage than the seventh read voltage VR7. When a threshold value is set and the number of memory cells having a higher threshold voltage than the seventh read voltage VR7 is determined to be smaller than the threshold value through a read operation on a wordline, a wordline, on which the read operation is performed, may be determined to be a dummy wordline.

An SPO may occur again during the performing of a normal program operation after the completion of the dummy program operation. As described above, when an SPO occurs, dummy data may be written on an open wordline according to the above-described embodiment. Also, when an SPO occurs, the memory controller 300 may read data on all wordlines of the memory cell array 410 of the memory device 400, and generate a mapping table according to a result of the read operation. An ECC operation is performed on the data read on each wordline, and data error-corrected by the ECC operation or data error-corrected by a repair algorithm may be, for example, identified as valid data in the mapping table.

On the other hand, in the case of the second and third wordlines WL1 and WL2 in which dummy data is written, an ECC failure may occur in the read data, and the dummy data may not be recovered by the repair algorithm. Also, the dummy data is irrelevant to user data and needs not be identified as valid data in the mapping table. However, since a repair algorithm is performed on the dummy data, an unnecessary operation and time consumption may occur.

The dummy WL detector 330 detects whether the wordline on which a read operation is performed corresponds to a dummy wordline in which dummy data is written. When dummy data is written according to the threshold voltage distribution of FIG. 7A, the seventh read voltage VR7 is used to read data on a wordline and then the number of memory cells having higher a threshold voltage than the seventh read voltage VR7 is counted (or the number of memory cells corresponding to an off cell is counted with respect to the seventh read voltage VR7). In the case of data read with respect to the second and third wordlines WL1 and WL2, the number of memory cells having a higher threshold voltage than the seventh read voltage VR7 may be smaller than the threshold value. In this case, the second and third wordlines WL1 and WL2 may be determined to be dummy wordlines. A repair algorithm operation by the repair algorithm performer 360 may be skipped with respect to the data read on the dummy wordline. On the other hand, when an ECC failure occurs in a normal wordline, a repair algorithm operation may be performed on the data of the normal wordline. That is, by detecting a threshold voltage distribution on each wordline and performing an error correction operation only on data of the normal wordline, a repair algorithm operation may be prevented from being performed on the dummy wordline.

FIG. 7B illustrates an example in which a position of a threshold voltage distribution of an erase state is changed to change a threshold voltage distribution of one state. For example, by increasing a level of a verify voltage for determining the erase state E and the first program state P1, a level of a threshold voltage of the erase state E after the dummy program operation is set to be higher than a level of a threshold voltage of the erase state E after the normal program operation. Thereafter, the first read voltage VR1 is used to perform a read operation on a wordline. When the number of memory cells having a lower threshold voltage than the first read voltage VR1 is smaller than a threshold value, the wordline may be determined to be a dummy wordline.

In the above-described embodiment, a dummy wordline is determined in a read operation for generating a mapping table after the occurrence of an SPO; however, at least some example embodiments of the inventive concepts are not limited thereto. For example, a read operation may be performed on a wordline through a normal read operation, and it may be determined whether the read data is a result of a read operation on the normal wordline or a read operation on the dummy wordline. For example, in the case of the read operation on the normal wordline, when an ECC failure occurs, a repair algorithm operation may be performed to use the data. On the other hand, in a case where the read data is determined to be the read operation on the dummy wordline, since the data is not user data, a repair algorithm operation may be skipped when an ECC failure occurs.

Figure 8:
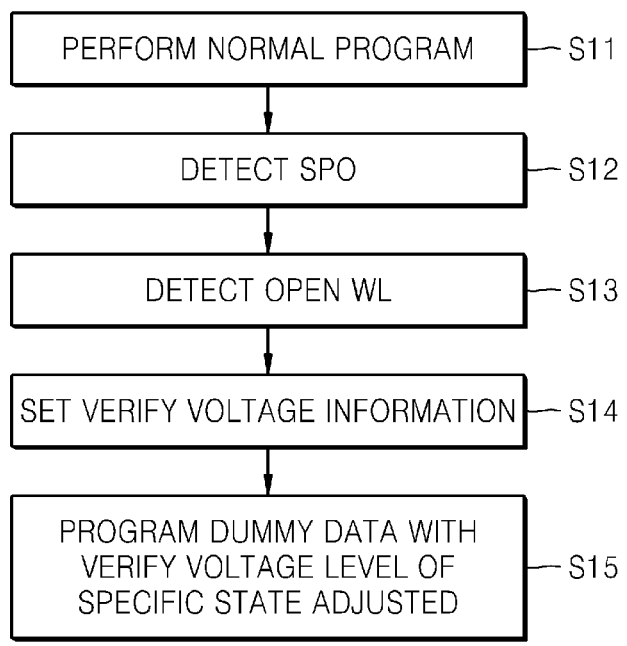
FIG. 8 is a flowchart of a method of operating a memory system, according to at least one example embodiment of the inventive concepts.

FIG. 8 is a flowchart of a method of operating a memory system, according to at least one example embodiment of the inventive concepts.

As illustrated in FIG. 8, a normal program operation is performed on a memory cell array of a non-volatile memory device (S11). As in the above-described embodiment, when 2 or more bits of data is programmed in each memory cell, a program operation may be performed a plurality of times of on each wordline.

An SPO may be detected during the normal program operation (S12) and thus some of the wordlines included in the memory cell array may correspond to open wordlines. An open wordline may be a wordline for which a multi-programming operation (e.g., an operation including multiple programming operations to store one set of data in cells of the wordline) has not yet been completed. For example, when a program operation is performed three times on each wordline, an SPO may occur in a wordline (for example, a first wordline) while only a program operation is performed one time or two times. In this case, the first wordline may correspond to an open wordline. An open wordline among a plurality of wordlines is detected (S13), and a dummy program operation is performed on the dummy wordline.

According to at least one embodiment of the inventive concepts, a level of a threshold voltage distribution of at least one state (for example, a first state) among a plurality of states may be set to be different from a level of a threshold voltage distribution of the first state. To this end, voltage information for changing a level of a verify voltage for programming data of the first state may be set (S14), and a dummy program operation may be performed with an adjusted verify voltage level of a specific state (for example, the first state) (S15). According to the above dummy program operation, a threshold voltage distribution may be formed as illustrated in FIG. 7A or 7B. As another example, a verify voltage level for programming data of another state (for example, a second state) may be adjusted. In this case, a position of a threshold voltage distribution corresponding to the second state may be changed.

Figure 9:
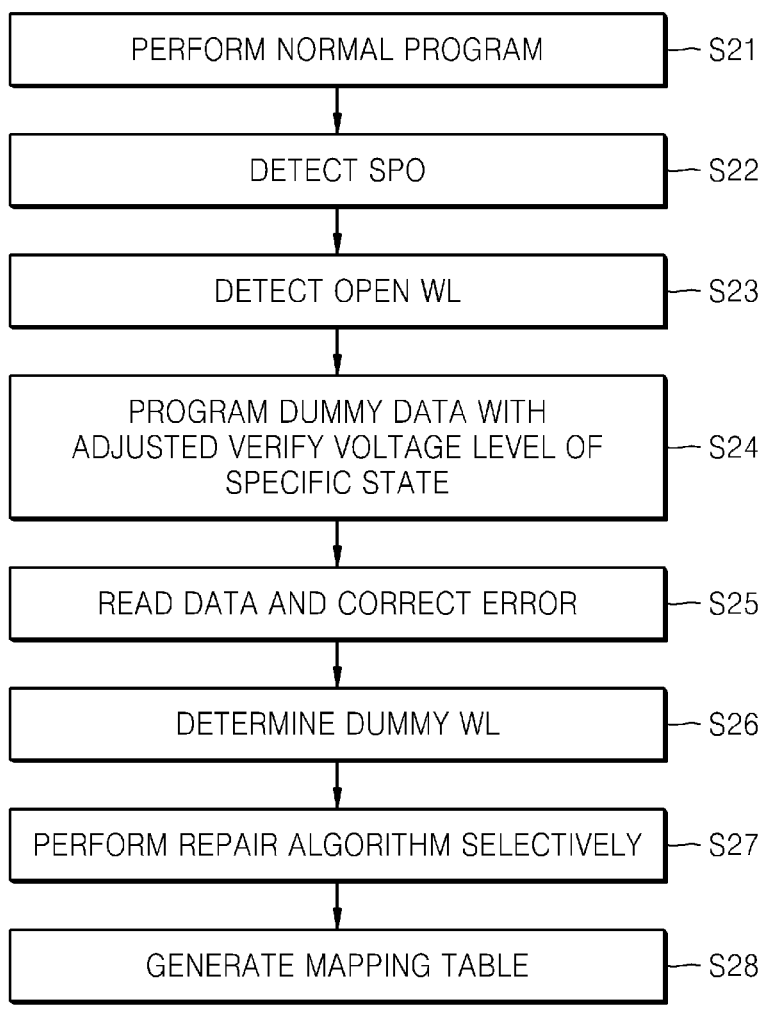
FIG. 9 is a flowchart of a method of operating a memory system, according to at least one example embodiment of the inventive concepts.

FIG. 9 is a flowchart of a method of operating a memory system, according to at least one example embodiment of the inventive concepts. FIG. 9 illustrates an example in which at least one example embodiment of the inventive concepts is applied to the process of generating a mapping table when an SPO occurs.

As in the method of FIG. 8, a normal program operation may be performed (S21), and an SPO may be detected during the performing of the normal program operation (S22). When an SPO occurs, some wordlines may correspond to open wordlines. An open wordline may be detected (S23), and a dummy program operation may be performed on the open wordline (S24). As in the above-described embodiment, a dummy program operation may be performed with an adjusted verify voltage level of a specific state (for example, the first state).

Together with the dummy program operation, under the control of a memory controller, a read operation may be performed on all wordlines of a memory cell array to generate a mapping table. Together with the data read operation, an ECC operation may be performed on the read data to correct an error in the data (S25). When an ECC error correction is possible, it may be determined to be an ECC pass; and when an ECC error correction is impossible, it may be determined to be an ECC failure.

In the event of an ECC failure, before performing a data recovery algorithm, it is determined whether or not the wordline is a dummy wordline (S26). As in the above-described embodiment, the dummy wordline determining operation may be performed by counting the number of memory cells having a specific state by using a predetermined read voltage and determining when a counting result is greater than or smaller than a threshold value. A repair algorithm operation is performed selectively according to the determination result. For example, when the wordline is a normal wordline in the event of an ECC failure, a repair algorithm operation is performed; and when the wordline is a dummy wordline in the event of an ECC failure, a repair algorithm operation is skipped. A mapping table is generated according to the above operation, and for example, a mapping table skipping the recording of dummy data may be generated (S28).

Figure 10:
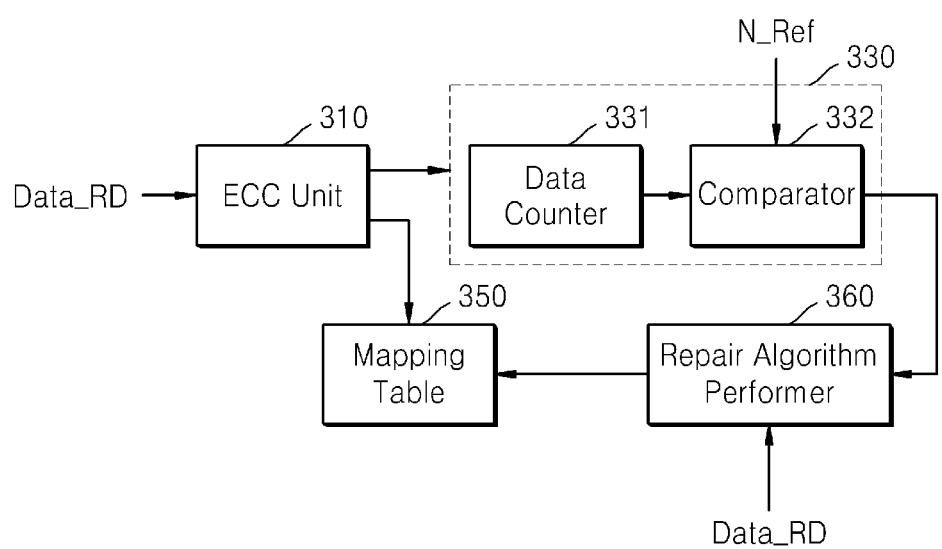
FIG. 10 is a block diagram of an example of a dummy wordline determining operation of a memory controller illustrated in FIG. 8.

FIG. 10 is a block diagram of an example of a dummy wordline determining operation of the memory controller 300 that is illustrated in FIG. 8. As illustrated in FIG. 10, the ECC unit 310 receives read data Data_RD and performs an error detection/correction operation on the read data Data_RD. The ECC-passed data may be, for example, identified in the mapping table 350 as valid data. The read data Data_RD may be data that is read from the memory cells connected to one wordline.

On the other hand, when an ECC failure occurs, the read data Data_RD is provided to the dummy WL detector 330. The dummy WL detector 330 may include a data counter 331 and a comparator 332. The data counter 331 may count, for example, the number of data groups (e.g., 3-bit groups for 3-bit memory cells) corresponding to a specific threshold voltage state among the read data Data_RD. For example, a threshold voltage state set or programmed into a memory cell is defined by the threshold voltage distribution (e.g., E0-P7) into which a threshold voltage of the memory cell falls. Referring to the graph of FIG. 7A, according to at least one example embodiment, the number of memory cells having a higher threshold voltage than the seventh read voltage VR7 (or the number of memory cells having a data value corresponding to an off cell) may be counted. The counting result is provided to the comparator 332. The comparator 332 compares the counting result with a threshold value N_Ref, and outputs the comparison result to the repair algorithm performer 360.

The repair algorithm performer 360 performs a repair algorithm operation on the read data Data_RD selectively according to the comparison result from the comparator 332. For example, when the read data Data_RD is data read from a normal wordline, the repair algorithm performer 360 performs an error repair algorithm on the ECC-failed read data Data_RD, and the error-repaired data is, for example, identified as valid data in the mapping table 350. On the other hand, when the read data Data_RD is data read from a dummy wordline, the repair algorithm performer 360 skips an error repair algorithm on the ECC-failed read data Data_RD and thus dummy data may not be identified as valid data in the mapping table 350.

Figure 11:
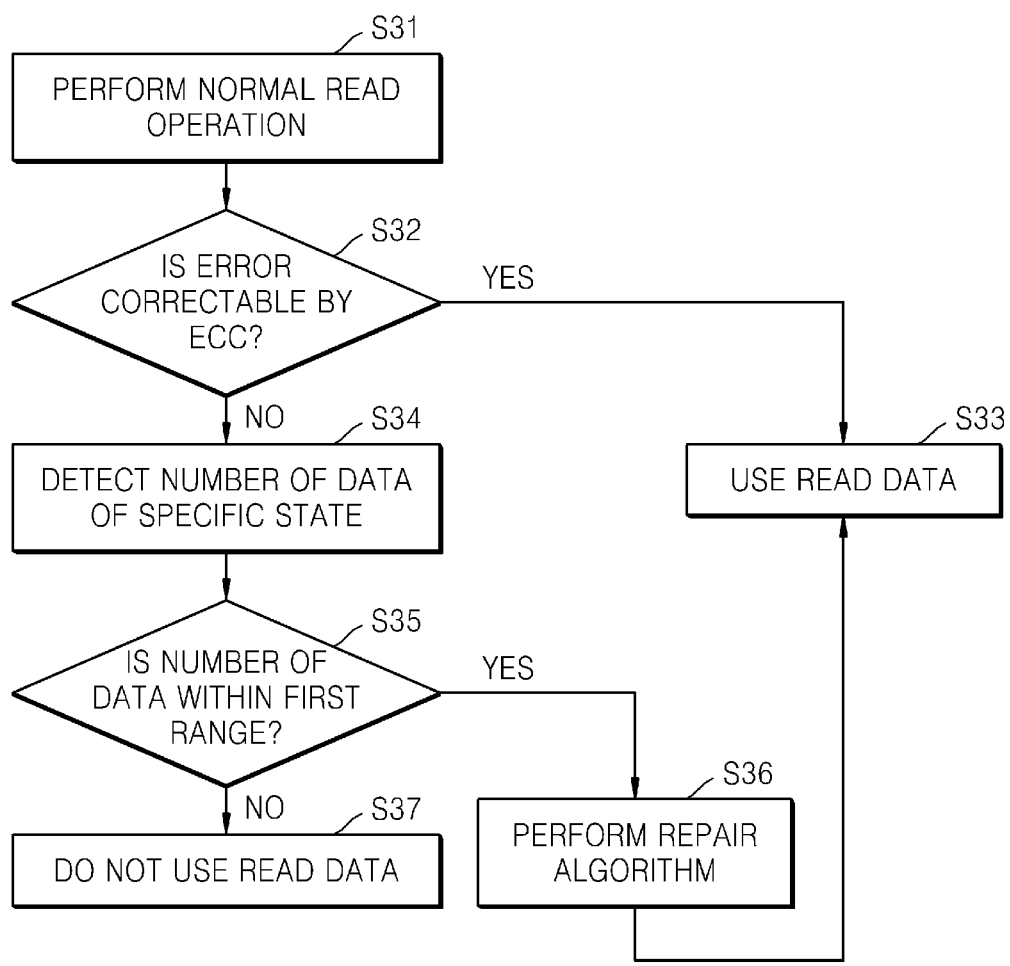
FIG. 11 is a flowchart of a method of operating a memory system, according to at least one example embodiment of the inventive concepts.

FIG. 11 is a flowchart of a method of operating a memory system, according to at least one example embodiment of the inventive concepts. FIG. 11 illustrates an example in which a repair algorithm is selectively performed in a normal read operation.

As illustrated in FIG. 11, a normal read operation is performed on the memory cell array (S31), and an error detection/correction operation is performed on the read data. Whether an error correction on the read data is possible by an ECC error correction operation is determined (S32). When the error correction is possible, the read data (or the error-corrected data) is normally used (S33).

On the other hand, when the error correction by an ECC error correction operation is impossible, the number of data groups corresponding to a specific threshold voltage state is detected to determine whether the wordline on which a read operation has been performed is a dummy wordline, before performing a repair algorithm. Whether the number of data groups corresponding to a particular threshold voltage state is within a predetermined or, alternatively, desired range (for example, a first range) is determined (S35), and whether the wordline is a dummy wordline is determined according to the determination result. In the above-described embodiment of FIG. 7A, the seventh read voltage VR7 may be used to perform a read operation on the wordline, whether the number of data groups corresponding to a particular threshold voltage state (or the number of memory cells corresponding to an off cell) is smaller than a threshold value may be determined, and the wordline may be determined to be a dummy wordline when the number of data groups corresponding to a particular threshold voltage state (e.g., state P7) is determined to be smaller than the threshold value. In the above-described embodiment of FIG. 7B, whether the number of data groups corresponding to a particular threshold voltage state among the data read by the first read voltage VR1 (or the number of memory cells corresponding to an on cell) is smaller than a threshold value may be determined, and the wordline may be determined to be a dummy wordline when the number of data groups corresponding to a particular threshold voltage state (e.g., state E) is determined to be smaller than the threshold value.

When the number of data groups corresponding to a particular threshold voltage state is within the first range, the wordline is determined to be a normal wordline. Accordingly, a repair algorithm is performed on the ECC-failed data (S36), and the error-corrected data may be normally used. On the other hand, when the number of data groups corresponding to a particular threshold voltage state is not within the first range, the wordline is determined to be a dummy wordline. Accordingly, a repair algorithm on the ECC-failed data is skipped, and the read data may not be used (S37).

Figure 12:
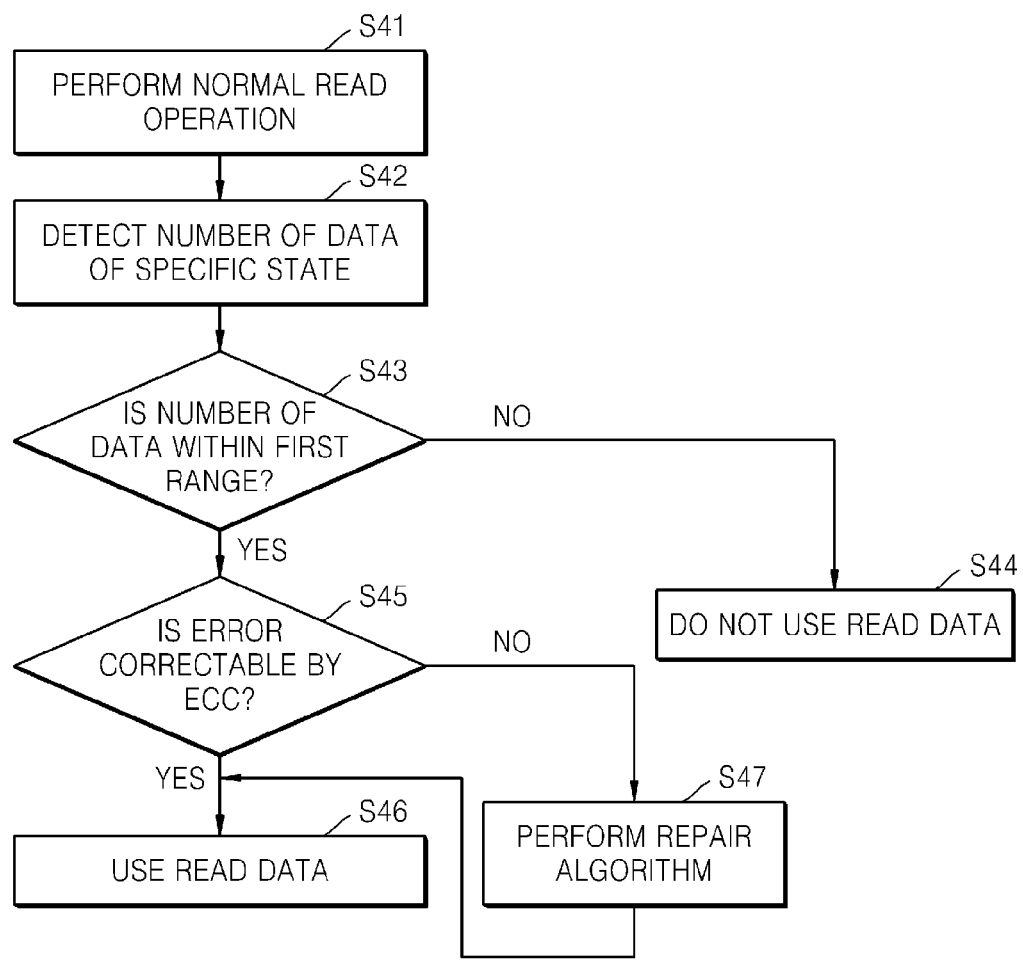
FIG. 12 is a flowchart of a method of operating a memory system, according to at least one example embodiment of the inventive concepts.

FIG. 12 is a flowchart of a method of operating a memory system, according to at least one example embodiment of the inventive concepts. FIG. 12 illustrates an example of a modification of the method of FIG. 11. In describing the method of operating a memory system, according to the embodiment of FIG. 12, a detailed description of the same operations of the method of FIG. 11 will be omitted herein.

As illustrated in FIG. 12, a normal read operation is performed on the memory cell array (S41), and the number of data groups corresponding to a particular threshold voltage state among the read data is detected to determine whether the wordline on which a read operation has been performed is a dummy wordline (S42). Whether the number of data groups corresponding to a particular threshold voltage state is within a predetermined range (for example, a first range) is determined (S43), and whether the wordline is a dummy wordline is determined according to the determination result. When the number of data groups corresponding to a particular threshold voltage state is not within the first range, the wordline may be determined to be a dummy wordline and thus the read data is not used (S44).

On the other hand, when the number of data groups corresponding to a particular threshold voltage state is within the first range, the wordline may be determined to be a normal wordline and thus a normal ECC error detection/correction operation is performed on the read data and a repair algorithm operation is performed. Whether an ECC error correction on the data read from the normal wordline is possible is determined (S45), and the read data is used when the read data ECC-passes (S46). On the other hand, when the read data ECC-fails, a repair algorithm operation is performed on the data (S47), and the data on which the repair algorithm has been performed is used as the read data.

Figure 13:
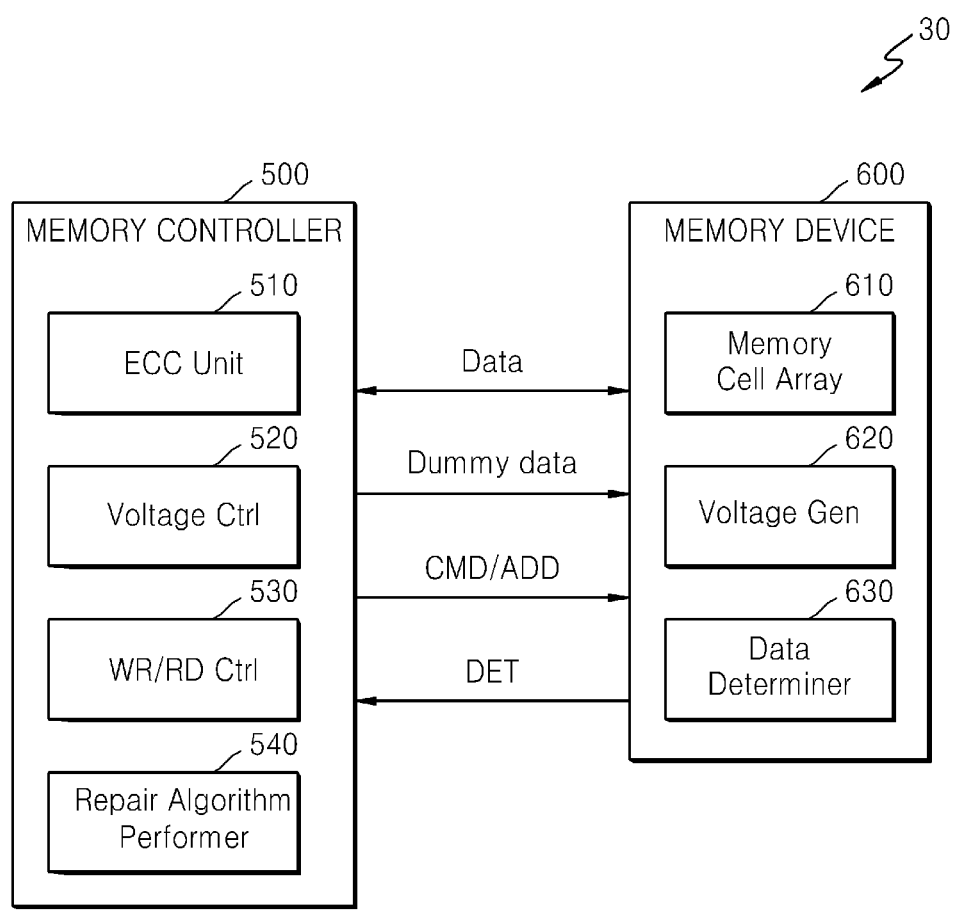
FIG. 13 is a block diagram of a memory system according to at least one example embodiment of the inventive concepts.

FIG. 13 is a block diagram of a memory system according to at least one example embodiment of the inventive concepts. FIG. 13 illustrates an example in which one or more operations for detecting a dummy wordline is performed in a non-volatile memory device. In describing the configuration illustrated in FIG. 13, a detailed description of the same operations described with reference to FIG. 6 will be omitted herein.

As illustrated in FIG. 13, the memory system 30 may include a memory controller 500 and a memory device 600. The memory controller 500 performs a control operation on the memory device 600. As an example, the memory controller 500 may include an ECC unit 510, a voltage controller 520, a WR/RD controller 530, and a repair algorithm performer 540. Also, the memory device 600 may include a memory cell array 610, a voltage generator 620, and a data determiner 630.

By determining the number of data groups corresponding to a particular threshold voltage state of memory cells connected to a predetermined wordline (for example, a first wordline), whether the first wordline is a dummy wordline may be detected. The number of data groups corresponding to a particular threshold voltage state may be determined by the data determiner 630 of the memory device 600, and the data determiner 630 may provide a data determination result DET to the memory controller 500. The data determiner 630 may provide a result of counting the number of data groups corresponding to a first threshold voltage state among the read data as the data determination result DET. As another example, information related to a threshold value as a reference value for determining a dummy wordline may be provided to the data determiner 630, and the data determiner 630 may provide a comparison result between the result of counting the number of data groups corresponding to first threshold voltage state and the threshold value as the data determination result DET.

The memory controller 500 may receive the data determination result DET and determine whether the first wordline is a dummy wordline. Also, data read from the first wordline may be provided to the memory controller 500, and the memory controller 500 may perform a repair algorithm on the read data when the first wordline is a normal wordline. On the other hand, when the first wordline is a dummy wordline, the memory controller 500 may skip a repair algorithm on the read data.

The memory systems 10, 20 and 30 may include one or more hardware processors configured to perform specific operations included in program code, or structurally configured to perform specific operations. For example, according to at least one example embodiment of the inventive concepts, the one or more hardware processors may be included in the memory controllers 100, 300 and 500 may be configured to perform any of the operations described herein as being performed by any of the storage devices 10, 20 and 30. For example, the one or more hardware processors may include at least one of a central processing unit (CPU), a digital signal processor (DSP), a multiprocessor, a field programmable gate array (FPGA), and an application specific integrated circuit (ASIC).

Figure 14:
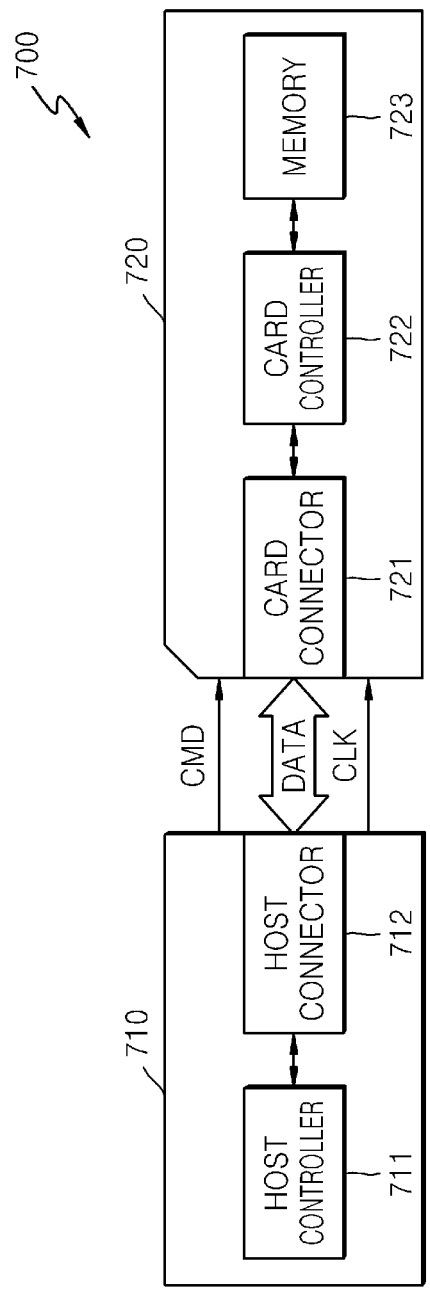
FIG. 14 is a block diagram of an example of an application of a memory system to a memory card, according to at least one embodiment of the inventive concepts.

FIG. 14 is a block diagram of an example of an application of a memory system to a memory card according to at least one example embodiment of the inventive concepts.

Referring to FIG. 14, a memory card system 700 may include a host 710 and a memory card 720. The host 710 may include a host controller 711 and a host connector 712. The memory card 720 may include a card connector 721, a card controller 722, and a memory device 723.

The host 710 may write data in the memory card 720 and read data stored in the memory card 720. The host controller 711 may transmit a command CMD, a clock signal CLK generated by a clock generator (not illustrated) in the host 710, and data DATA to the memory card 720 through the host connector 712.

The card controller 722 may store data in the memory device 723, in synchronization with a clock signal generated by a clock generator (not illustrated) in the card controller 722, in response to a command received through the card connector 721. The memory device 723 may store data received from the host 710. According to at least one example embodiment of the inventive concepts, the card controller 722 may perform the same operations and include the same structure as those described above with reference to any or all of the memory controllers 100, 300 and 500. According to at least one example embodiment of the inventive concepts, the memory device 723 may perform the same operations and include the same structure as those described above with reference to any or all of the memory devices 200, 400 and 600.

The memory card 720 may be implemented by a compact flash card (CFC), a microdrive, a smart media card (SMC), a multimedia card (MMC), a security digital card (SDC), a memory stick, or a USB flash memory driver.

Figure 15:
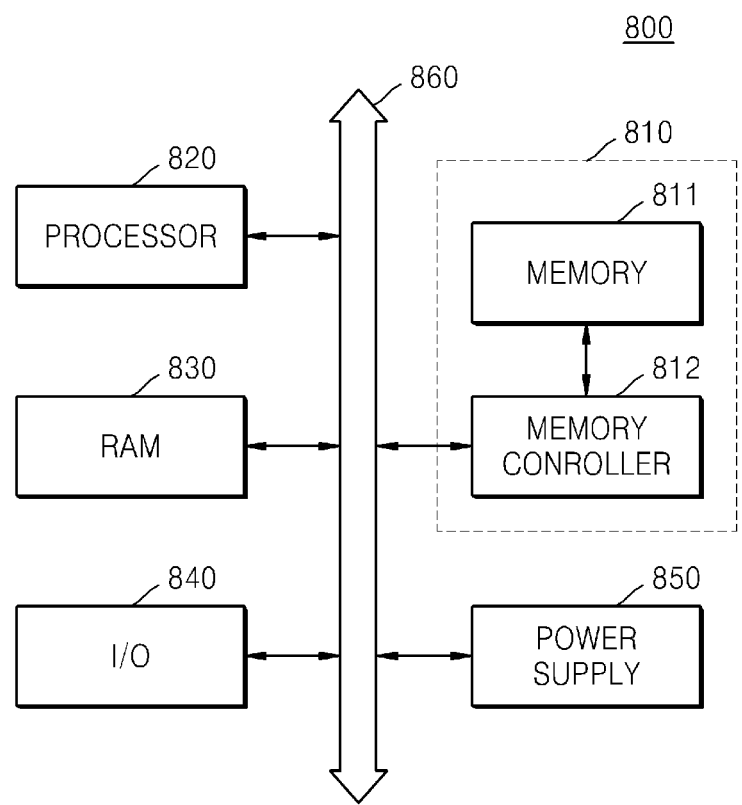
FIG. 15 is a block diagram of a computing system including a memory system, according to at least one embodiment of the inventive concepts.

FIG. 15 is a block diagram of a computing system 800 including a memory system according to at least one embodiment of the inventive concepts.

Referring to FIG. 15, the computing system 800 may include a memory system 810, a processor 820, RAM 830, an I/O device 840, and a power supply device 850. Although not illustrated in FIG. 15, the computing system 800 may further include a video card, a sound card, a memory card, and ports for communicating with a USB device or other electronic devices. The computing system 800 may be implemented as a personal computer or a portable electronic device such as a notebook computer, a portable phone, a PDA, or a camera. According to at least one example embodiment of the inventive concepts, the memory system 810 may perform the same operations and include the same structure as those described above with reference to any or all of the memory systems 10, 20 and 30.

The processor 820 may perform calculations or tasks. According to an embodiment, the processor 820 may be a microprocessor or a central processing unit (CPU). The processor 820 may communicate with the RAM 830, the I/O device 840 and the memory system 810 through buses 860 such as an address bus, a control bus, and a data bus. According to an embodiment, the processor 820 may also be connected to an extended bus such as a peripheral component interconnect (PCI) bus.

The RAM 830 may store data necessary for an operation of the computing system 800. For example, the RAM 830 may be implemented by DRAM, mobile DRAM, SRAM, PRAM, FRAM, RRAM, and/or MRAM.

The I/O device 840 may include input units such as a keyboard, a keypad, and a mouse, and an output unit such as a display. The power supply device 850 may supply an operation voltage necessary for an operation of the computing system 800.

Figure 16:
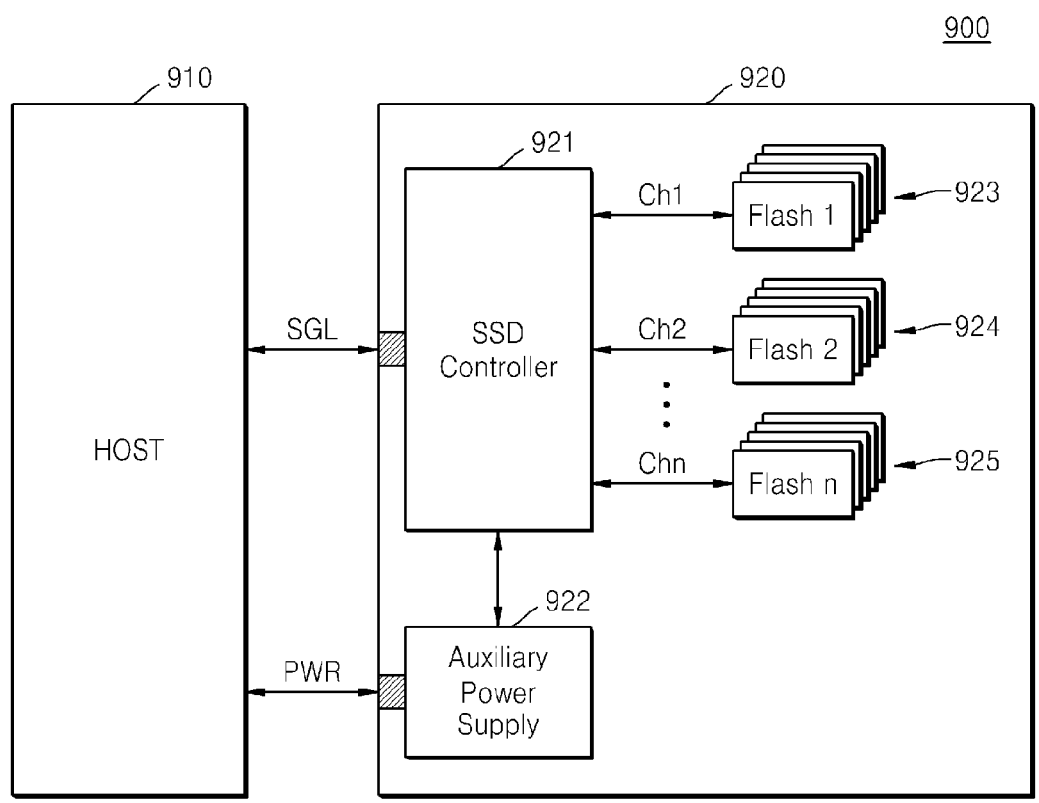
FIG. 16 is a block diagram of an example of an application of a memory system to a solid state drive (SSD), according to at least one embodiment of the inventive concepts.

FIG. 16 is a block diagram of an example of an application of a memory system to a solid state drive (SSD), according to at least one embodiment of the inventive concepts.

Referring to FIG. 16, an SSD system 900 may include a host 910 and an SSD 920. The SSD 920 communicates signals with the host 910 through a signal connector, and receives power through a power connector. The SSD 920 may include an SSD controller 921, an auxiliary power supply device 922, and a plurality of memory devices 923, 924, and 925. In this case, the SSD controller 921 or the memory devices 923, 924, and 925 may include a unit for detecting a dummy wordline according to the above-described embodiment. For example, according to at least one example embodiment of the inventive concepts, the SSD controller 921 may perform the same operations and include the same structure as those described above with reference to any or all of the memory controllers 100, 300 and 500. According to at least one example embodiment of the inventive concepts, the memory devices 923, 924, and 925 may each perform the same operations and include the same structure as those described above with reference to any or all of the memory devices 200, 400 and 600.

Example embodiments having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A method of operating a memory system, the method comprising:
   reading data of first memory cells, the first memory cells being connected to a first wordline from among a plurality of wordlines, the plurality of wordlines including one or more dummy wordlines and one or more normal wordlines;
   determining whether the first wordline is one of the one or more dummy wordlines by determining, based on the read data, a number of the first memory cells having a first threshold voltage state, the one or more dummy wordlines being wordlines the memory cells of which have been programmed with dummy data, the one or more normal wordlines being wordlines that are not dummy wordlines; and
   performing a repair algorithm for correcting an error in the read data, selectively according to a result of the determination.

2. The method of claim 1, further comprising:
   performing an error correction code (ECC) operation on the read data,
   wherein the determining of whether the first wordline is one of the one or more dummy wordlines is performed when an ECC failure has occurred in the read data.

3. The method of claim 2, further comprising:
   performing a repair algorithm on the read data in which the ECC failure has occurred when the first wordline is determined to be one of the one or more normal wordlines,
   wherein a repair algorithm is not performed on the read data in which the ECC failure has occurred when the first wordline is determined to be one of the one or more dummy wordlines.

4. The method of claim 1, wherein completing an operation of storing multi bit data in memory cells of a wordline selected for programming, from among the plurality of wordlines, includes performing a programming operation on the selected wordline a plurality of times, and the method further comprises:
   beginning the operation of storing multi bit data in the first wordline;
   determining whether the first wordline is an open wordline after a sudden power-off (SPO) occurs, open wordlines being wordlines, from among the plurality of wordlines, on which the operation of storing multi bit data began but was not completed at the time of the SPO, the SPO being an event where power being supplied to the memory system ceases, the normal wordlines being wordlines that are neither dummy wordlines nor open wordlines; and
   programming dummy data in the memory cells connected to the first wordline, when the first wordline is determined to be an open wordline.

5. The method of claim 4, wherein a level of a first verify voltage for programming dummy data corresponding to a first threshold voltage state in the memory cells connected to an open wordline, from among the plurality of wordlines, is set to be different from a level of a second verify voltage for programming data of the first threshold voltage state in memory cells connected to one of the one or more normal wordlines.

6. The method of claim 5, wherein the level of the first verify voltage is set to be lower than the level of the second verify voltage.

7. The method of claim 1, further comprising:
   reading data of memory cells connected to second to nth wordlines from among the plurality of wordlines, n being an integer equal to or greater than 2; and
   generating a mapping table by identifying read data corresponding to a normal wordline as valid data in the mapping table and not identifying read data corresponding to a dummy wordline as valid data in the mapping table.

8. The method of claim 1, wherein an ECC operation is not performed on the read data when the first wordline is determined to be one of the one or more dummy wordlines.

9. The method of claim 1, wherein
   the first threshold voltage state corresponds to a threshold voltage distribution that has the greatest threshold voltage among levels of a plurality of threshold voltage distributions, and
   the first wordline is determined to be one of the one or more dummy wordlines when number of the first memory cells having the first threshold voltage state is smaller than a threshold value.

10. The method of claim 1, wherein each of the first memory cells is a multi-level cell that stores 2 or more bits of data.

11. A method of operating a memory system, the method comprising:
   programming user data by performing a program operation n times on memory cells connected to a first wordline, n being an integer equal to or greater than 2;
   determining a second wordline to be an open wordline, open wordlines being wordlines upon the memory cells of which less than n program operations are performed; and
   programming dummy data in memory cells connected to the second wordline,
   wherein a level of a first verify voltage for programming user data corresponding to a first threshold voltage state in the memory cells connected to the first wordline is set to be different from a level of a second verify voltage for programming dummy data corresponding to the first threshold voltage state in the memory cells connected to the second wordline.

12. The method of claim 11, wherein a voltage level of a threshold voltage distribution corresponding to the first threshold voltage state of the memory cells connected to the first wordline is greater than a voltage level of a threshold voltage distribution corresponding to the first threshold voltage state of the memory cells connected to the second wordline.

13. The method of claim 11, further comprising:
detecting a sudden power-off (SPO), the SPO being an event where power being supplied to the memory system ceases,
wherein the determining of the second wordline is performed after the SPO is detected.

14. The method of claim 11, further comprising:
reading data of the memory cells connected to the second wordline by using a first read voltage; and
detecting a number of the memory cells having the first threshold voltage state based on the read data,
wherein a repair algorithm is not performed on the read data read from the memory cells connected to the second wordline, based on a result of the detection.

15. The method of claim 11, further comprising:
reading data of the memory cells connected to the second wordline by using a first read voltage; and
detecting a number of the memory cells having the first threshold voltage state based on the read data; and
performing an error correction operation on the read data read from the memory cells connected to the second wordline selectively according to a result of the detection.

16. A method of operating a memory system including a memory device, the method comprising:
storing multi bit groups of data in a plurality of memory cells, the storing including programming a selected threshold state into a first memory cell of the plurality of memory cells, the selected threshold state being the one of a plurality of threshold states that corresponds the multi bit group of data being stored in the first memory cell, the plurality of memory cells being connected to a selected wordline of the memory device;
reading the data stored in the plurality of memory cells;
determining a number of the plurality of memory cells having a first threshold voltage state from among the plurality of threshold voltage states based on the read data;
determining whether the selected wordline is a dummy wordline or a normal wordline based on the determined number; and
performing a repair algorithm for correcting an error in the read data of the plurality of memory cells when the selected wordline is determined not to be the dummy wordline.

17. The method of claim 16, wherein for at least the first threshold voltage state of the plurality of threshold voltage states,
when the selected wordline is determined to be the dummy wordline, a first programming verification voltage is used when programming the first threshold voltage state into memory cells from among the plurality of memory cells,
when the first wordline is determined to be the normal wordline, a second programming verification voltage is used when programming the first threshold voltage state into memory cells from among the plurality of memory cells, and
the first programming verification voltage is different from the second programming verification voltage.

* * * * *